United States Patent [19]
Knapp et al.

[11] Patent Number: 5,846,649
[45] Date of Patent: *Dec. 8, 1998

[54] HIGHLY DURABLE AND ABRASION-RESISTANT DIELECTRIC COATINGS FOR LENSES

[75] Inventors: Bradley J. Knapp, Kutztown; Fred M. Kimock, Macungie; Rudolph Hugo Petrmichl, Center Valley; Brian Kenneth Daniels, Allentown, all of Pa.

[73] Assignee: Monsanto Company, St. Louis, Mo.

[ * ] Notice: The term of this patent shall not extend beyond the expiration date of Pat. No. 5,618,619.

[21] Appl. No.: 632,610

[22] Filed: Apr. 15, 1996

Related U.S. Application Data

[63] Continuation-in-part of Ser. No. 205,898, Mar. 3, 1994, Pat. No. 5,508,368, and Ser. No. 205,954, Mar. 3, 1994, Pat. No. 5,618,619.

[51] Int. Cl.$^6$ ...................................................... B32B 9/04
[52] U.S. Cl. ........................... 428/334; 428/447; 428/448; 428/412; 428/423.1; 428/425.5; 428/334; 428/508.8
[58] Field of Search ...................................... 428/447, 448, 428/450, 451, 469, 412, 423.1, 425.5, 334, 908.8; 264/1.32

[56] References Cited

U.S. PATENT DOCUMENTS

| | | |
|---|---|---|
| 3,847,652 | 11/1974 | Fletcher et al. . |
| 4,085,248 | 4/1978 | Zehender et al. . |
| 4,096,315 | 6/1978 | Kubacki . |
| 4,168,330 | 9/1979 | Kaganowicz . |
| 4,217,038 | 8/1980 | Letter . |
| 4,282,267 | 8/1981 | Kuyel . |
| 4,382,100 | 5/1983 | Holland . |
| 4,474,827 | 10/1984 | Ferralli . |
| 4,490,229 | 12/1984 | Mirtich et al. . |
| 4,647,494 | 3/1987 | Meyerson et al. . |
| 4,649,071 | 3/1987 | Tajima et al. . |
| 4,661,409 | 4/1987 | Kieser et al. . |
| 4,762,730 | 8/1988 | Enke et al. . |
| 4,776,925 | 10/1988 | Fossum et al. . |
| 4,777,090 | 10/1988 | Ovshinsky et al. . |
| 4,778,721 | 10/1988 | Sliemers et al. . |
| 4,783,374 | 11/1988 | Custer et al. . |
| 4,795,656 | 1/1989 | Mizoguchi et al. . |
| 4,800,100 | 1/1989 | Herbots et al. . |
| 4,830,873 | 5/1989 | Benz et al. . |
| 4,842,941 | 6/1989 | Davies et al. . |
| 4,862,032 | 8/1989 | Kaufman et al. . |
| 4,927,704 | 5/1990 | Reed et al. . |
| 4,942,065 | 7/1990 | Factor et al. . |
| 4,990,376 | 2/1991 | Patel . |
| 4,992,298 | 2/1991 | Deutchman et al. . |
| 5,013,690 | 5/1991 | Hochberg et al. . |
| 5,051,308 | 9/1991 | Reed et al. . |
| 5,061,567 | 10/1991 | Brochot et al. . |
| 5,093,152 | 3/1992 | Bonet et al. . |
| 5,093,153 | 3/1992 | Brochot et al. . |
| 5,135,808 | 8/1992 | Kimock et al. . |
| 5,156,882 | 10/1992 | Rzad et al. . |
| 5,190,807 | 3/1993 | Kimock et al. . |
| 5,206,060 | 4/1993 | Balian et al. . |
| 5,266,398 | 11/1993 | Hioki et al. . |
| 5,268,217 | 12/1993 | Kimock et al. . |
| 5,618,619 | 4/1997 | Petrmichl et al. ...................... 428/334 |

FOREIGN PATENT DOCUMENTS

| | | |
|---|---|---|
| 0299754 | 1/1989 | European Pat. Off. . |
| 0395198 | 10/1990 | European Pat. Off. . |
| 0528540 | 2/1993 | European Pat. Off. . |

OTHER PUBLICATIONS

G. Dearnaly, Clinical MAterials, vol. 12, pp. 237–244, Diamond–like Carbon: A Potential Means of Reducing Wear in Total Joint Replacement, 1993.

Wrobel, A.M., Kryszewski, M. Progr. Colloid Polym. Sci., vol. 85, p. 91 (1991).

*Primary Examiner*—Mary E. Mosher

[57] ABSTRACT

An abrasion-resistant dielectric composite product is described comprising a substrate and an abrasion wear resistant coating material comprising carbon, hydrogen, silicon, and oxygen and a dielectric material. An improved method is provided for the deposition of highly durable and abrasion-resistant multilayer dielectric antireflective coatings and reflective colored mirror coatings onto plastic lenses such as ophthalmic lenses, safety lenses, sunglass lenses, and sports optics. An adhesion-enhancing polymer layer may be deposited onto the plastic substrate prior to deposition of the abrasion-resistant first coating layer. The multilayer dielectric coating structure consists of a transparent, highly abrasion-resistant first coating, and a second dielectric coating composed of at least one layer of dielectric material. The abrasion-resistant first coating layer is deposited by ion-assisted plasma deposition from mixtures of organosiloxane or organosilazane precursor gases and oxygen, and has the properties of Nanoindentation hardness in the range of about 2 GPa to about 5 GPa, a strain to microcracking greater than about 1.5% and less than about 3.5%, a transparency greater than 85% throughout the visible spectrum, and an abrasion resistance greater than or equal to the abrasion resistance of glass. The preferred method for deposition of the abrasion-resistant first coating layer is plasma ion beam deposition using an organosiloxane precursor gas and oxygen. Optimum abrasion-resistance is obtained when the first coating layer thickness is in the range of about 5 microns to about 20 microns. The thickness, refractive index, and number of the dielectric layers in the second coating are chosen to produce the desired optical effects of either antireflection, or reflected color. Optimum environmental durability and abrasion-resistance is obtained by producing highly dense dielectric coatings by ion beam assisted electron beam evaporation, magnetron sputtering, ion beam assisted magnetron sputtering, ion beam sputtering, and ion-assisted plasma deposition, including plasma ion beam deposition, from precursor gases.

46 Claims, 1 Drawing Sheet

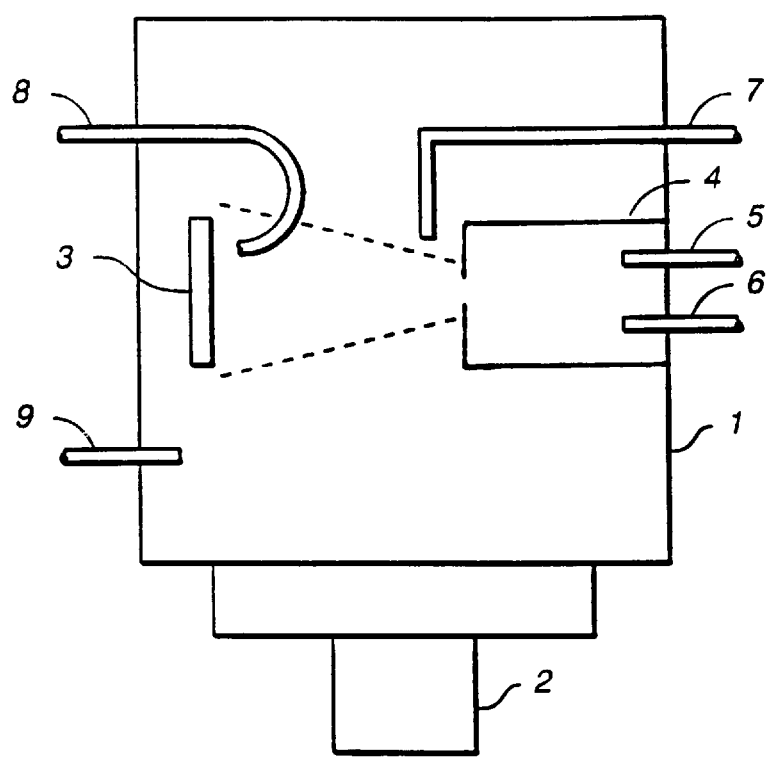
FIG._1

HIGHLY DURABLE AND ABRASION-RESISTANT DIELECTRIC COATINGS FOR LENSES

This application is a continuation-in-part of patent applications Ser. No. 08/205,898 filed Mar. 3, 1994, now U.S. Pat. No. 5,508,368, (Docket No. 6051/52637), and Ser. No. 08/205,954 filed Mar. 3, 1994, now U.S. Pat. No. 5,618,619 (Docket No. 6051/52638)

FIELD OF THE INVENTION

This invention relates generally to a process for depositing highly durable and abrasion-resistant composite multi-layer dielectric coatings on lenses. More particularly, the invention relates to a process for depositing highly durable and abrasion-resistant antireflective coatings and reflective colored mirror coatings onto plastic ophthalmic lenses, safety lenses, sunglass lenses, and sports optics.

BACKGROUND OF THE INVENTION

For the purposes of this application, the definition of "lens" is intended to include a variety of transparent plastic articles which permit viewing, including but not limited to vision correcting ophthalmic eyeglass, sunglass lenses and safety lenses which are typically mounted in a frame as spectacles; plano safety lenses and sunglass lenses without optical power needed for vision correction; shield lenses for sunwear and sports optics products, typically of plano configuration; and visors.

Dielectric coatings are commonly applied to plastic lenses to achieve a variety of optical effects. Two of the most common types of optical coatings are antireflection coatings ("AR coatings") which are employed on ophthalmic eyeglass lenses, and colored mirror coatings which are employed on sunglass lenses and sports optics. In the case of AR coatings, a multilayered coating structure composed of alternating layers of dielectric material(s) with relatively high refractive index, and dielectric material(s) with relatively lower refractive index is deposited onto the convex and concave sides of a lens. The thickness and number, and type of individual coating layers, is chosen using techniques that are well-known in the prior art, based on the refractive index of each dielectric material and the desired reflection spectrum of the complete coating. Multilayered coating structures having alternating layers of low refractive index material and high refractive index material, with a low refractive index material as the top coating layer are the most common broad-band AR coatings used on plastic lenses today. The most common dielectric materials used include a variety of optically transparent oxides, nitrides, and fluorides.

Typical dielectric materials used in optical coatings (and their refractive indices, n, at 550 nm) include, but are not limited to: aluminum oxide ($Al_2O_3$, n=1.63), barium fluoride ($BaF_2$, n=1.47), boron nitride (BN, n=1.8–2.3), hafnium oxide ($HfO_2$, n=2.02), lanthanum fluoride ($LaF_3$, n=1.58), lanthanum oxide ($La_2O_3$, n=1.90), magnesium fluoride ($MgF_2$, n=1.38), magnesium oxide (MgO, n=1.70), scandium oxide ($Sc_2O_3$, n=1.90), silicon monoxide (SiO, n=2.00), silicon dioxide ($SiO_2$, n=1.46), silicon nitride ($Si_3N_4$, n=2.10), silicon oxy-nitride ($SiO_xN_y$, n=1.7–2.0), tantalum oxide $Ta_2O_5$, n=2.16), titanium oxide ($TiO_2$, n=2.32), tin oxide ($SnO_2$, n=2.00), indium tin oxide (InSnOx, n=2.02), yttrium oxide ($Y_2O_3$, n=1.88), zinc oxide (ZnO, n=2.10), zinc selenide (ZnSe, n=2.65), zinc sulfide (ZnS, n=2.36), zirconium oxide ($ZrO_2$, n=2.05), and so-called "Substance 1", which is a mixture of zirconium oxide and zirconium titanate ($ZrO_2+ZrTiO_4$, n=2.10). Diamond-like carbon (DLC), with refractive index controllable between 1.7 and 2.2, could also be utilized as a high index material in an AR coating stack.

In the case of reflective colored mirror coatings, e.g. on sunglass lenses or sports optics, a multilayered coating structure, typically composed either of alternating layers of high refractive index dielectric material(s) and low refractive index dielectric materials(s), or a single high refractive index layer is deposited onto the convex side of a lens. A layer of silicon monoxide, silicon dioxide, or other material may be used as an adhesion layer between the substrate and the high refractive index material. Finally, to enhance the amount of reflectivity in the mirror coating, a thin metallic layer, may be incorporated as one of the layers in the coating stack. In this case, the thickness of the metallic layer is typically <100 Å. Typical metallic materials used as reflecting layers in optical coatings include, but are not limited to: aluminum, chromium, germanium, hafnium, silicon, tantalum, titanium, and zirconium. Application of one or more transparent dielectric layers on top of the thin metallic layer produces a reflected color, by optical interference effects which are well known in the art. A variety of dielectric materials, including zirconium oxide, titanium oxide, hafnium oxide, silicon dioxide, silicon monoxide and DLC are used today in the commercial production of colored mirror coatings for sunwear products and sports optics, including lenses and wrap-around shields. For example, Kimock, et al., U.S. Pat. Nos. 5,135,808 and 5,190,807 disclose a direct ion-beam deposition process for producing abrasion wear-resistant DLC coatings on products such as optical lenses and sunglass lenses.

For both AR coatings and colored mirror coatings, the dielectric layers are most commonly deposited by thermal evaporation, electron beam evaporation, ion beam assisted electron beam evaporation, or magnetron sputtering techniques which are well-known in the prior art.

While substantial improvements in environmental durability of these AR coatings and reflective colored mirror coatings have been made via the use of ion beam assisted deposition processes, AR coatings on plastic ophthalmic lenses and colored mirror coatings on plastic sunglass lenses remain very susceptible to damage by abrasion and scratching. Thus, improved coating methods are still required to produce dielectric coatings on plastic lenses which have excellent durability and resistance to abrasion and scratching.

Plastic ophthalmic lenses are typically made from materials such as polycarbonate, CR-39 poly(allyl diglycolcarbonate) or other acrylics, or "high index" plastics which can be olefins, urethanes, or copolymers of acrylics and other polymers. Plastic sunwear lenses are typically made from either poly(allyl diglycolcarbonate), acrylics, or polycarbonate. These plastic lenses are typically coated with acrylic, urethane, or polysiloxane dip coatings or spin coatings. Although these coatings significantly improve the abrasion resistance of the lenses compared to uncoated plastic, the abrasion-resistance of coated plastic lenses is still inferior to that of glass lenses.

Because of its light weight, superior impact resistance, and high refractive index, polycarbonate is often the material of choice for fabrication of ophthalmic lenses, sunglass lenses, and sports optics. Of all the optical plastics, polycarbonate is also the most easily damaged by scratching and abrasion. Therefore, AR coatings and colored mirror coatings on polycarbonate lenses are also highly subject to damage by scratching and abrasion.

In coatings applied to plastic lenses, flexibility or elasticity is desirable so that crazing does not occur during flexure or bending of the substrate. In addition, with increased coating flexibility, degradation in the impact resistance of the lens is avoided, and deep scratches are less noticeable. Flexibility, or conversely brittle behavior can be quantified by stretching or bending a sample with the coating on the convex surface and measuring the percent elongation (100 $\Delta L/L$) at which the coating fails, i.e. develops fine cracks. This percent elongation will be referred to herein as the strain to microcracking.

SUMMARY OF THE INVENTION

The invention provides an improved method for deposition of highly durable and abrasion-resistant antireflective coatings and reflective colored mirror coatings onto lenses, such as ophthalmic lenses, safety lenses, sunglass lenses, and sports optics.

Products produced by the method of the present invention include an optical substrate, e.g. a lens, which is coated on at least one surface by a highly durable and abrasion-resistant dielectric composite product. An adhesion-enhancing polymer layer, e.g. polysiloxane, acrylic, urethane, or other polymer coating, having thickness of about 1 to about 10 micrometers, may be deposited onto the optical substrate prior to deposition of the abrasion-resistant coating material.

The multilayer abrasion-resistant dielectric composite comprises a first coating of substantially transparent, highly abrasion-resistant, and a second coating of at least one layer of dielectric material.

The transparent, abrasion-resistant composite coating is comprised of the elements of C, Si, H, O, and possibly N. The abrasion-resistant coating is deposited by ion-assisted plasma deposition from mixtures of organosiloxane or organosilazane precursor gases and oxygen, and has the properties of Nanoindentation hardness in the range of about 2 GPa to about 5 GPa, a strain to microcracking greater than about 1.5% and less than about 3.5%, a transparency greater than 85% throughout the visible spectrum, and an abrasion resistance greater than or equal to the abrasion resistance of glass. The preferred mode of ion-assisted plasma deposition of the abrasion-resistant first coating layer is plasma ion beam deposition using an organosiloxane or organosilazane precursor gas and oxygen. Optimum abrasion-resistance is obtained when the abrasion-resistant material is deposited on the substrate as a layer having thickness in the range of about 5 micrometers to about 20 micrometers.

Prior to deposition of the abrasion-resistant coating layer, a transparent adhesion layer comprised of the elements C, Si, H, O, and possibly N may be deposited by ion-assisted plasma deposition from mixtures of organosiloxane or organosilazane precursor gases and inert gases such as argon. This layer is used to enhance adhesion of the abrasion-resistant layer on plastics such as acrylics and poly(allyl diglycolcarbonate) and polycarbonate, and may be applied to polymer-coated plastic substrates as well. This layer, along with the abrasion-resistant layer comprise a first composite abrasion-resistant coating.

The thickness, refractive index, and number of the dielectric material layers in the second coating are chosen to produce the desired optical effects of either antireflection, or reflected color. The dielectric layers may be deposited by a variety of vacuum deposition methods. Optimum environmental durability and abrasion-resistance is obtained by producing highly dense dielectric coatings by ion beam assisted electron beam evaporation, magnetron sputtering, ion beam assisted magnetron sputtering, ion beam-assisted electron beam evaporation, ion beam sputtering, and ion-assisted plasma deposition, including plasma ion beam deposition from precursor gases.

The dielectric coating materials used in the present invention include diamond-like carbon (DLC). The DLC coating material can be used as a layer within the multilayer coating stack, or can be used as the top or outer layer, in which case the DLC provides additional abrasion protection, chemical resistance, barrier properties and reduced surface friction.

BRIEF DESCRIPTION OF THE DRAWING

Further features and advantages will become apparent from the following and more particular description of the preferred embodiment of the invention, as illustrated in the accompanying drawing in which:

FIG. 1 is a diagrammatic view of an illustrative apparatus used to manufacture coated lenses in accordance with a plasma ion beam process.

DETAILED DESCRIPTION OF THE INVENTION

The method of the present invention substantially reduces or eliminates the disadvantages and shortcomings associated with the prior art techniques by providing for the deposition of highly durable and abrasion-resistant dielectric coating composite on plastic lenses such as ophthalmic lenses, safety lenses, sunglass lenses, and sports optics.

The process for the manufacture of the coatings of the present invention produces remarkable performance on a variety of soft optical plastics. The remarkable performance compared to prior art techniques is the result of the combination of the critical features and attributes listed below. The method of the present invention is capable of:

(1) producing excellent adhesion of the coating to the substrate by generating an atomically clean surface prior to the deposition of the coating;

(2) producing a highly abrasion-resistant, transparent composite first coating layer of thickness in the range of about 5 micrometers to about 20 micrometers, and is about 10 to 20 times harder than the plastic substrate, and provides a more rigid structural support for subsequent deposition of the layers of dielectric material(s);

(3) producing a highly abrasion-resistant, yet flexible and extensible first coating layer on a variety of soft plastic substrates;

(4) producing highly transparent, dense and adherent dielectric coating layers;

(5) obtaining minimal batch-to-batch variation in the properties of the coatings because process parameters such as ion energy, ion current density, gas flow rate, and deposition chamber pressure are largely de-coupled in the plasma ion beam deposition method of the present invention, and because each of these process parameters can be accurately controlled and reproduced to a high degree of certainty, often to within 1%;

(6) producing excellent lens-to-lens coating thickness uniformity because the plasma ion beam deposition method of the present invention is compatible with commercially available substrate holders incorporating motion, i.e. rotation and/or planetary motion.

The preferred method of the present invention comprises the following steps. The substrate is first chemically cleaned to remove contaminants. In the second step, the substrate is inserted into a vacuum coating chamber and the air in the chamber is evacuated. After evacuation of the chamber, the substrate surface is etched by a flux of energetic ions or other reactive species to assist in the removal of residual contaminants such as residual hydrocarbons and surface oxides, and to activate the surface. After the substrate surface has been etched and activated, a transparent, highly abrasion-resistant composite first coating layer of thickness in the range of about 5 mm to about 20 mm is deposited by an ion-assisted deposition process such as plasma ion beam deposition from mixtures of organosiloxane or organosilazane precursor gases and oxygen.

The first composite abrasion-resistant coating layer may include a transparent adhesion layer comprised of the elements C, Si, H, O, and possibly N which is deposited by ion-assisted plasma deposition from mixtures of organosiloxane or organosilazane precursor gases and inert gases such as argon. Next, a second dielectric coating layer composed of at least one layer of dielectric material is deposited by ion beam assisted electron beam evaporation, magnetron sputtering, ion beam assisted magnetron sputtering, ion beam sputtering, or ion-assisted plasma deposition, including plasma ion beam deposition from precursor gases. In the case of reflective colored mirror coatings, a thin metallic layer may be interposed between the first abrasion-resistant layer and the dielectric materials to enhance reflectivity and color characteristics. The deposition of layers of dielectric materials is continued until the desired optical reflection or transmission spectrum of the coated product is achieved. At this point, the deposition process on the substrate is terminated, the vacuum chamber pressure is increased to atmospheric pressure, and the coated plastic substrates having highly durable and abrasion-resistant dielectric coatings are removed from the vacuum chamber.

In the preferred embodiment of this invention, mixtures of organosiloxane or organosilazane precursor gases and $O_2$ are introduced into the vacuum coating chamber, and deposition process conditions are adjusted so that transparent, highly abrasion-resistant coatings with the combination of the following seven physical properties are produced, which combination of properties are remarkable when compared to prior art coatings:

(1) transparency greater than 85% in the visible spectrum;

(2) yellow index, as defined by ASTM D1925, less than 5, preferably less than 2.5;

(3) haze, as defined by ASTM D1003, less than 2%;

(4) hardness, as measured by a Nano Instruments, Inc. nanoindentor with displacements in the range of about 50 to about 200 nanometers, of about 2 GPa to about 5 GPa;

(5) less than 2% change in haze during Taber Abrasion by ASTM D1044;

(6) strain to microcracking greater than 1%, preferably greater than about 2%; and less than about 3.5%;

(7) compressive stress less than about $5\times10^9$ dynes/cm$^2$.

The combination of transparency greater than 85% throughout the visible spectrum, a yellow index of less than 5, and haze of less than 2% as measured by ASTM D1003 ensures that the coatings of the present invention are suitable for use in optical applications such as ophthalmic lenses, safety lenses, and sports optics.

The combination of hardness greater than 2 GPa, strain to microcracking of greater than 1%, and excellent adhesion ensure that the coating will provide excellent abrasion protection on a variety of soft plastic substrates as set forth in (5) above relating to Taber abrasion.

The ability to keep the internal compressive stress of the coating to less than $5\times10^9$ dynes/cm$^2$ coupled with excellent adhesion allows the deposition of thick coatings on a variety of substrates. It is necessary to have coating thicknesses greater than one micron in order to obtain excellent abrasion protection on soft substrates. It is preferred to have coating thickness from about 1 to about 100 micrometers thick. It is most preferred to have thickness of the abrasion-resistant coating layer in the range of about 5 micrometers to about 20 micrometers.

Excellent adhesion of the deposited coating layer(s) is produced by generating an atomically clean surface prior to the deposition of the composite abrasion-resistant first coating layer. The coating is preferably deposited immediately upon completion of the sputter-etching and activation step to achieve maximum adhesion to the substrate. Deposition of the coating layer(s) immediately upon completion of the etching step minimizes the possibility for recontamination of the etched surface with vacuum chamber residual gases or other contaminants.

The plasma ion beam deposition apparatus for producing the preferred embodiment of the present invention is illustrated schematically in FIG. 1. The preferred coating process for deposition of transparent, flexible, highly abrasion-resistant coating layers using a plasma ion beam deposition apparatus shown in FIG. 1 is set forth in detail in the copending applications, Ser. No. 08/205,898 (Docket No. 6051/52637), and Ser. No. 08/205,954 (Docket No. 6051/52638); the details of which are incorporated herein by reference. This process is carried out inside a high vacuum chamber 1, which is fabricated according to techniques known in the art. Vacuum chamber 1 is evacuated into the high vacuum region by first pumping with a rough vacuum pump (not shown) and then by a high vacuum pump 2. Pump 2 can be a diffusion pump, turbomolecular pump, cryogenic pump ("cryopump"), or other high vacuum pumps known in the art. Use of a diffusion pump with a cryogenically cooled trap at the inlet (not shown) such as a cryocoil or cryopanel for pumping water vapor is a preferred high vacuum pumping arrangement for producing the products of the present invention. The cryocoil or cryopanel also enables the use of higher flow rates of condensible precursors, and protects the high vacuum pumps from contamination by the condensible precursor materials. The use of cryopumps with carbon adsorbents is somewhat less advantageous than other high vacuum pumps because such cryopumps have a low capacity for hydrogen which is generated by the ion beam sources used to produce the products of the present invention. The low capacity for hydrogen results in the need to frequently regenerate the adsorbent in the cryopumps.

It is understood that the process of the present invention can be carried out in a batch-type vacuum deposition system, in which the main vacuum chamber is evacuated and vented to atmosphere after processing each batch of parts; a load-locked deposition system, in which the main vacuum deposition chamber is maintained under vacuum at all times, but batches of parts to be coated are shuttled in and out of the deposition zone through vacuum-to-air load locks; or in-line processing vacuum deposition chambers, in which parts are flowed constantly from atmosphere, through differential pumping zones, into the deposition chamber, back through differential pumping zones, and returned to atmospheric pressure.

Substrates to be coated are mounted on substrate holder 3, which may incorporate tilt, simple rotation, planetary motion, or combinations thereof. For coating lenses, domed planetary substrate holders known in the art have been found to be successful. The substrate holder can be in the vertical (as shown) or horizontal orientation, or at any angle in between. It is preferred to have a vertical component to the orientation of the substrates on the holder to minimize particulate contamination of the substrates, but if special precautions such as low turbulence vacuum pumping and careful chamber maintenance are practiced, the substrates can be mounted in the horizontal position facing upward, and held in place by gravity. This horizontal geometry can be most easily visualized by rotating the illustration in FIG. 1 by 90 degrees so that the ion beam source is at the top of the page. This horizontal mounting is advantageous from the point of view of easy fixturing of small substrates which are not easily clamped in place. The opposite horizontal geometry, with the ion beam source at the bottom of the page pointed upward, and the substrates facing downward, is advantageous for a process in which the deposition of dielectric materials is performed by evaporation. When dielectric materials are deposited by sputtering, the vertical (as shown) or either of the two horizontal orientations of the apparatus may be used.

Prior to deposition, the substrates are ion beam sputter-etched with an energetic plasma ion beam generated by ion beam source 4. Ion beam source 4 is most preferably a gridless ion source such as a Hall Accelerator or End Hall ion source of U.S. Pat. No. 4,862,032; the description of which is incorporated by reference herein. The ion source beam is charge neutralized by introduction of electrons into the beam using a neutralizer (not shown), which may be a thermionic filament, plasma bridge, hollow cathode, or other types known in the prior art.

Ion source 4 is provided with inlets 5 and 6 for introduction of gases directly into the ion source plasma chamber. Inlet 5 is used for introduction of inert gases, such as argon, krypton, and xenon, for the sputter-etching. Additionally, during the sputter-etching step, oxygen may be introduced in inlet 6, and used independently or mixed with an inert gas to provide chemically-assisted sputter-etching. Inlet 6 may also be used for introduction of reactive gases such as hydrocarbons (e.g. methane, acetylene, cyclohexane), organosiloxanes, organosilazanes, oxygen, nitrogen, hydrogen, ammonia, and similar gases for the coating deposition. During the coating deposition, the reactive gases can be mixed with an inert gas to modify the properties of the resultant coating and improve the stability of the ion source.

At least a portion of the reactive organosiloxane, organosilazane, or other precursor gases is introduced downstream of the ion source and into the ion beam by inlet 7. Inlet 7 may contain multiple holes for the introduction of reactive gases, or may be a "gas distribution ring". Volatile precursors can be contained in some type of vessel (not shown) which may be heated, and introduced directly into the vacuum chamber by inlet 7 via a metering valve (not shown) or mass flow controller (not shown) located between the containment vessel and inlet 7. The precursor materials can also be introduced using a liquid delivery mass flow controller (not shown) followed by an evaporator (not shown) which feeds inlet 7.

Finally, reactive gases for the deposition, e.g. oxygen and ammonia, can be introduced at or near the substrate by inlet 8, or into the chamber background by inlet 9. The reactive gases introduced by inlet 8 modify the properties of either the abrasion-resistant material or the dielectric materials by chemical reaction at the surface of the coating during deposition.

Additionally, to improve the deposition rate and throughput of the coating machine, multiple ion sources 4 can be utilized and operated simultaneously. Operation of the ion sources can be sequenced for the case in which different coating materials are deposited from each ion source. As described in U.S. Pat. No. 4,490,229, an additional ion source (not shown) can be used to co-bombard the substrates during coating deposition to alter the film properties.

It is understood that deposition of the transparent, highly abrasion-resistant first coating layer may also be performed by other variations of ion-assisted plasma deposition, as described in copending application Ser. No. 08/205,954 (Docket No. 6051/52638); the details of which are incorporated herein by reference.

Deposition of coating layers of dielectric materials may be carried out by several methods. In the first method, the dielectric material is plasma ion beam deposited by injection of at least a portion of a reactive precursor gas downstream of the ion source and into the ion beam by inlet 7. A variety of dielectric materials may be deposited this way, e.g. titanium oxide, silicon nitride, silicon oxy-nitride, silicon dioxide, and other materials. DLC dielectric layers can be direct ion beam deposited with plasma ion beam source 4 using hydrocarbon gases such as methane, acetylene, cyclohexane, butane and benzene by introducing these gases directly into the ion source plasma chamber through inlets 5 and 6, or downstream of the ion source and into the ion beam via inlet 7.

Alternatively, the dielectric layers required to produce optical antireflection or colored mirror effects may be deposited by a variety of other vacuum deposition methods known in the art. For example, the dielectric materials may be deposited by evaporation from solid sources using a thermal resistance evaporation or electron beam evaporation sources (not shown). During evaporative deposition, the dielectric materials may be bombarded by a beam of ions (e.g. argon or oxygen) which may be produced by ion source 4.

The dielectric materials may also be deposited by sputtering from a magnetron sputter source (not shown) which can be operated with either a radio frequency plasma, or a d.c. plasma with injection of reactive gas. The sputter-deposited dielectric materials may be bombarded by a beam of ions (e.g. argon or oxygen) which may be produced by ion source 4.

Finally, the dielectric layers may be deposited by ion beam sputtering carried out using a high energy ion beam from gridded ion source (not shown), directed onto a dielectric or metallic sputtering target (not shown). In ion beam sputter deposition, reactive gas (e.g. oxygen) is typically added in the area of the substrates via inlet 8, or to the vacuum chamber background via inlet 9 to insure proper stoichiometry of the depositing dielectric coating layer.

The evaporation and sputtering sources are not shown in FIG. 1, but can be readily integrated into the apparatus of FIG. 1 to achieve the required coating thickness uniformity and properties of dielectric materials by techniques known in the art.

Suitable plastic substrate materials for the present invention include, but are not limited to polycarbonate, poly(allyl diglycolcarbonate), acrylics, polymethylmethacrylate, olefins, urethanes and co-polymers and blends thereof. These plastic substrates may be coated with polymer layers consisting of, but not limited to polysiloxane, acrylic, and urethane polymer coatings which are applied by spin-coating or dip-coating processes. The thickness of the polymer coatings is typically in the range of about 1 micrometer to about 10 micrometers. The polymer layers improve the durability of the plastic substrate for handling purposes, and in some cases have been found to improve the adhesion of the abrasion-resistant first coating layer to the substrate.

According to the method of the present invention, the substrate is first chemically cleaned to remove contaminants, such as residual hydrocarbons and other contaminants, from the substrate manufacturing and handling processes. Ultrasonic cleaning in solvents, or other aqueous detergents as known in the art is effective. Details of the cleaning procedure depend upon the nature of the contamination and residue remaining on the part after manufacture and subsequent handling. It has been found that it is critical for this chemical cleaning step to be effective in removing surface contaminants and residues, or the resulting adhesion of the coating will be poor.

In the second step of the process, the substrate is inserted into a vacuum chamber, and the air in the chamber is evacuated. For the case of plasma ion beam deposition, typically, the vacuum chamber is evacuated to a pressure of $1 \times 10^{-5}$ Torr or less to ensure removal of water vapor and other contaminants from the vacuum system. However, the required level of vacuum which must be attained prior to initiating the next step must be determined by experimentation. For the case of ion-assisted plasma deposition, typically, the vacuum chamber is typically evacuated to $5 \times 10^{-3}$ Torr or less. The exact level of vacuum is dependent upon the nature of the substrate material, the sputter-etching rate, the constituents present in the vacuum chamber residual gas, and the details of the coating process. It is not desirable to evacuate to lower pressures than necessary, as this slows down the process and reduces the throughput of the coating system.

In the third step of the process, the substrate surface is bombarded by a flux of energetic ions or exposed to reactive species to sputter-etch or remove residual contaminants, e.g. any residual hydrocarbons, surface oxides and other unwanted materials not removed in the first step, and to activate the surface. This etching of the substrate surface is required to achieve high adhesion between the substrate surface and the coating layer(s). Ions for the etching and activation step can be extracted from a plasma by a substrate bias, or can be delivered to the substrate surface as an ion beam. By the term "ion beam", it is intended to mean a beam of ions generated from a plasma which is remote from the substrate. For the case of the plasma ion beam deposition process, it is convenient to utilize the same ion source 4, which is used to deposit the abrasion-resistant coating material, for generation of the sputter-etching ion beam.

The ion beam is typically charge neutralized with electrons obtained from a variety of possible sources including but not limited to a thermionic hot filament, a plasma bridge neutralizer or a hollow cathode. Charge neutralization of the ion beam allows the processing of electrically insulating substrates in a very stable fashion since the potential of the substrate is maintained. The sputter-etching can be carried out with inert gases such as argon, krypton, and xenon. Additionally, hydrogen or oxygen may be added to the inert gases to assist in etching and activation of the surface. The sputter-etching source gas is typically introduced directly into the plasma chamber of the ion source via inlets 5 or 6, but can also be introduced into the vacuum chamber via inlets 7, 8, or 9. Typically, in order to achieve efficient and rapid ion sputter-etching, the ion beam energy is greater than 20 eV and the pressure in the area around the substrates is in the range of about $1 \times 10^{-4}$ Torr to about $5 \times 10^{-3}$ Torr so that ion-gas collisions can be minimized. Ion energies as high as 2000 eV can be used, but ion beam energies less than 500 eV result in the least amount of atomic scale damage to the substrate.

Immediately after the substrate surface has been etched, a composite first layer of abrasion-resistant coating material is deposited on the substrate by a deposition flux which includes energetic ions and contains the elements C, Si, H, O, and optionally N. This ion flux is generated by "activation" of organosiloxane or organosilazane precursor gases in a plasma or in a plasma ion beam. For the plasma ion beam deposition process, at least a portion of the precursor gas is introduced away from the ion source plasma chamber and into the ion beam by inlet 7. Examples of suitable organosiloxane and organosilazane precursors include, but are not limited to: hexamethyldisiloxane, tetramethylcyclotetrasiloxane, octamethylcyclotetrasiloxane, hexamethyldisilazane, tetramethylcyclotetrasilazane, tetramethyldisilazane and mixtures thereof. These organosiloxane and organosilazane precursor gases may be blended with inert gases such as argon to achieve adhesion layers containing the elements C, Si, H, O, and optionally N, prior to deposition of the abrasion-resistant coating materials of the present invention. In the preferred embodiment, these organosiloxane and organosilazane precursor gases are blended with oxygen and the conditions in the plasma or the plasma ion beam are adjusted to achieve the abrasion-resistant coating materials of the present invention. In the plasma ion beam deposition process, the oxygen gas is typically introduced into the plasma chamber of the ion source by inlet 5 or 6.

Examples of "activation" include, but are not limited to ionization, simple electronic excitation, chemical reaction with other ion and neutral species which may be electronically excited, and decomposition into simpler ionic or neutral species which may be electronically excited. Ions are extracted from the plasma or plasma ion beam source and strike the surface to be coated with energies from about 10 eV to about 1500 eV. The activated precursor species which are not ionized may also condense on the surface of the substrate to be coated. The ion impact energy depends on the electric field between the point of origin of the ion and the sample, and the loss of energy due to collisions which occur between the ion and other ionic or neutral species prior to the impingement of the ion onto the substrate. Other activated species, e.g. activated oxygen, argon, nitrogen, may also condense on the substrate surface. Neutral species will strike the surface with a variety of energies, from thermal to 100's of eV, depending on the origin of the neutral. This highly energetic deposition process produces highly adherent, very dense and hard coatings on the substrate surface. The density, hardness and other properties of the abrasion-resistant first coating layer are dependent on the energetics of the deposition process as well as the precursor gases used.

In the plasma ion beam process, the primary process control parameters are the organosiloxane or organosilazane precursor gas flow, the oxygen gas flow, the pumping speed, the ion beam energy and current density. Typical pressures in the deposition zone around the substrate for the plasma ion beam process of the present invention are in the range of about $10^{-4}$ Torr to about $5 \times 10^{-3}$ Torr so that ion-gas collisions can be minimized, thereby maintaining the high energy ion bombardment of the surface which is necessary for the formation of dense, hard coatings.

In the ion-assisted plasma process, the primary control parameters are the flow rate ratio of oxygen to organosiloxane or organosilazane precursor, the bias voltage, and the substrate temperature. The useful range of the latter is, however, limited for temperature sensitive substrates such as plastics. Other process parameters that affect the coating properties in the ion-assisted plasma process are the total flow rate, discharge power, pressure, size and shape of electrodes, and the presence of external magnetic fields.

The deposition process of the composite abrasion-resistant first coating layer is continued until a coating thickness in the range of about 1 micrometer to about 100 micrometers is obtained. Using reciprocating steel wool abrasion tests, it was found that the steel wool abrasion resistance increased dramatically as the thickness of the first coating layer was increased from 1 micrometer to 5 micrometers. For thicknesses greater than 20 micrometers, the incremental improvement in steel wool abrasion resistance is small. Therefore, it has been found that for the most highly abrasion-resistant coated lenses, the optimum thickness of the first layer is in the range of about 5 micrometers to about 20 micrometers.

Upon completion of the formation of the abrasion-resistant first coating layer of the present invention, at least one layer of dielectric material is deposited. Optimally, the composite dielectric layer is deposited immediately after completion of the abrasion-resistant first coating layer, in the same vacuum chamber and in the same vacuum cycle. This eliminates the added cost of additional pumpdown cycles, and improves the quality of the interface between the abrasion-resistant first coating layer and the dielectric layer. However, if that is not possible, the lens substrate coated with the abrasion-resistant first coating layer can be removed from the vacuum chamber and transferred to a different vacuum coating chamber for deposition of the dielectric layer(s).

The next step in the process for highly durable and abrasion-resistant multilayer coatings is the deposition of the second composite layer which consists of at least one layer of dielectric material. The thickness, refractive index, and number of the dielectric layers in the second composite layer are chosen to produce the desired optical effects of either antireflection, or reflected color. The physical thickness of individual layers of dielectric material is typically less than 3,000 Å. The dielectric materials may include, but are not limited to aluminum oxide, barium fluoride, boron nitride, hafnium oxide, indium tin oxide, lanthanum fluoride, lanthanum oxide, magnesium fluoride, magnesium oxide, scandium oxide, silicon monoxide, silicon dioxide, silicon nitride, silicon oxy-nitride, tantalum oxide, tin oxide, titanium oxide, yttrium oxide, zinc oxide, zinc selenide, zinc sulfide, zirconium oxide, a mixture of zirconium oxide and zirconium titanate, and diamond-like carbon (DLC).

It is noted that the abrasion-resistant Si—O—C—H ("silicon oxy-carbide") and Si—O—C—N—H ("silicon oxy-carbonitride") coating layers, if deposited at reduced thickness, can also be used effectively as dielectric layers in the second composite dielectric coating layer of the present invention.

The term DLC is meant to include amorphous materials composed of carbon and hydrogen, whose properties resemble, but do not duplicate, those of diamond. Some of these properties are high hardness (HV=about 10 GPa to about 50 GPa), low friction coefficient (approximately 0.1), transparency across the majority of the electromagnetic spectrum, and chemical inertness. At least some of the carbon atoms in DLC are bonded in chemical structures similar to that of diamond, but without long range crystal order. These DLC materials can contain up to 50 atomic percent of hydrogen. The DLC coatings are hard, inert and slippery, and are ideal for use in optical as well as many non-optical applications. The DLC materials may also contain dopant atoms such as nitrogen and silicon.

The dielectric layers may be deposited by a variety of vacuum deposition methods. In the first method, the dielectric material is deposited by ion-assisted plasma deposition from precursor gases, or by plasma ion beam deposited by injection of at least a portion of a reactive precursor gas downstream of the ion source and into the ion beam using a nozzle or distribution ring. A variety of dielectric materials may be deposited this way, e.g. titanium oxide using Ti-containing precursor materials such as titanium isopropoxide and oxygen; silicon nitride using organosilane or organosilazane precursor materials such as hexamethylcyclotetrasilazane, tetramethyldisilazane, or hexamethyldisilazane and nitrogen and possibly hydrogen; silicon oxy-nitride using organosilane or organosilazane precursor materials such as hexamethylcyclotetrasilazane, tetramethyldisilazane, or hexamethyldisilazane precursor gas, and oxygen and possibly nitrogen; silicon dioxide using organosiloxane precursors such as hexamethyldisiloxane and oxygen; and other materials. Likewise, DLC dielectric layers may be deposited by ion-assisted plasma deposition as in U.S. Pat. No. 4,382,100, or direct ion beam deposition. For sake of process simplicity, rapid deposition, and ease of scale-up to mass production, direct ion beam deposition from a hydrocarbon gas source is the most preferred DLC deposition process for this invention. Methane or cyclohexane are preferred as the hydrocarbon source gases, but other hydrocarbon gases, such as acetylene, butane, and benzene can be used as well. Hydrogen and inert gases, e.g. argon, krypton, and xenon, may be introduced into the plasma or plasma ion beam source to modify the DLC film properties. The ion impact energy used in the DLC deposition process may be in the range of approximately 20 eV to approximately 1000 eV. Ion energies in the range of about 20 eV to about 300 eV are most preferred to minimize heating of the substrate during deposition.

Alternatively, the dielectric layers may be deposited by a variety of other vacuum deposition methods known in the art. For example, the dielectric materials may be deposited by evaporation from solid sources using a thermal resistance evaporation or electron beam evaporation sources. However, since the plastic optical substrates of interest have low melting points and cannot be heated to the optimum temperatures for evaporative deposition, these methods produce layers of dielectric materials with porosity and poor durability. Therefore, when the dielectric materials are deposited by evaporation, the dielectric layers must be densified during deposition by ion bombardment by a beam of ions (e.g. argon or oxygen) which may be produced by a plasma ion beam source. Ion bombardment by reactive ions (e.g. oxygen) also permits the deposition of dielectric material layers with optimum stoichiometry.

The dielectric materials, including DLC, may also be deposited by sputtering from a magnetron sputter source. Magnetron sputter deposition of dielectric layers can be performed by sputtering a dielectric target with a radio frequency plasma, or by sputtering a metallic target with a d.c. plasma, and injecting reactive gas into the plasma. In the latter case, deposition with a pulsed power supply, or utilization of arc suppression circuitry is required. During high rate deposition of dielectric materials by magnetron sputtering, it is advantageous to densify the layers during deposition by ion bombardment by a beam of ions (e.g. argon or oxygen) which may be produced by the plasma ion beam source. As in the case of evaporative deposition, ion bombardment of the depositing layers by reactive ions (e.g. oxygen) during magnetron sputter deposition permits the deposition of dielectric materials with optimum stoichiometry.

Finally, the deposition of the dielectric layers, including DLC, may be performed by ion beam sputtering, in which a high energy ion beam, typically from a gridded ion source, directed onto a dielectric or metallic sputtering target. Atoms eject from the target and deposit on the substrates to form a coating. Reactive gas (e.g. oxygen) is typically added in the area of the substrates, or to the vacuum chamber background to insure proper stoichiometry of the depositing dielectric coating layer.

Optimum environmental durability and abrasion-resistance is obtained by producing highly dense dielectric coatings by use of any well known techniques which utilize high energy atoms or ions during the deposition process. Preferably environmental durability and abrasion-resistance is obtained by one of the following techniques: ion-assisted plasma deposition, including plasma ion beam deposition, ion beam assisted electron beam evaporation, magnetron sputtering, ion beam assisted magnetron sputtering, and ion beam sputtering.

Deposition of the desired number and type of dielectric layers, based on the optical coating design, is continued until the coating is completed, and the desired optical effect (e.g. antireflection or reflective colored mirror) is achieved. Once the chosen thickness of the top dielectric coating layer has been achieved, the deposition process on the substrates is terminated, the vacuum chamber pressure is increased to atmospheric pressure, and the coated lens substrates with a highly durable and abrasion-resistant composite dielectric coating are removed from the vacuum chamber.

In an another embodiment of the present invention, in the event that an enhanced reflectivity colored mirror and a simple optical design with a minimum number of layers is required, a layer of semi-transparent reflective metallic material is incorporated as one of the layers inside the coating stack. This layer structure produces a reflected color, by optical interference effects which are well known in the art. In this case, the thickness of the metallic layer is typically <100 Å to allow sufficient optical transmission of the lens. Typical metallic materials used as reflecting layers in optical coatings include, but are not limited to: aluminum, chromium, germanium, hafnium, silicon, tantalum, titanium, and zirconium. The metallic layer may be deposited either directly onto the abrasion-resistant first coating layer, or on top of a dielectric material in the second composite-dielectric coating. The colored mirror coating is then completed by deposition of one or more transparent dielectric layers on top of the thin metallic layer. Once the chosen thickness of the top dielectric coating layer has been achieved, the deposition process on the substrates is terminated, the vacuum chamber pressure is increased to atmospheric pressure, and the coated colored mirror lenses with a highly durable and abrasion-resistant composite dielectric coating are removed from the vacuum chamber.

Therefore, the following different forms of the highly durable and abrasion-resistant composite multilayer dielectric coated lens product are made possible with the present invention:

(1) A lens with a highly durable, abrasion-resistant anti-reflection coating, by depositing the abrasion-resistant first coating layer on at least the convex side of the lens (or on both sides of the lens), followed by deposition of a composite dielectric coating consisting of multiple layers of dielectric materials with at least two different refractive indices, on both sides of the lens;

(2) A lens with a highly durable, abrasion-resistant colored mirror coating, by depositing the abrasion-resistant first coating layer on at least the convex side of the lens, followed by deposition of a multilayer dielectric coating on the convex side of the lens;

(3) A lens with a highly durable, abrasion-resistant colored mirror coating, by depositing the abrasion-resistant first coating layer on at least the convex side of the lens, followed by deposition of a thin metallic layer, and at least one dielectric layer on top of the metallic layer on the convex side of the lens.

In each case, the optimum environmental durability and abrasion-resistance is obtained by producing highly dense dielectric coatings by a deposition technique in which high energy atoms or ions bombard the dielectric material during the deposition process.

DLC dielectric coating materials can be used advantageously in several ways in the present invention. First, DLC can be used as a high refractive index layer within the multilayer coating stack in an AR coating or complete dielectric colored mirror coating design. In this case, high atomic packing density and low permeation (i.e. water vapor barrier) of DLC result in a coating with excellent environmental durability and weatherability. Second, DLC can be used as the top coating layer in a variety of optical coating designs, especially in colored mirrors. The high atomic packing density, hydrophobic nature, hardness, and low friction coefficient of DLC result in a coating with outstanding environmental durability, abrasion-resistance, and cleanability.

It has been found that deposition of interlayer materials which contain silicon atoms onto the substrate prior to deposition of the DLC layer results in highly adherent DLC coatings with outstanding wear resistance properties. It is currently believed that reaction between silicon atoms in the interlayer material and the carbon atoms in the DLC layer is critical for the DLC coating to exhibit excellent adhesion. Therefore, the abrasion-resistant first coating layer of the present invention is an excellent adhesion layer for the DLC.

Finally, other low friction dielectric top layers such as boron nitride, tin oxide, and indium tin oxide can also be utilized to achieve the beneficial effect of improved abrasion-resistance.

The examples which follow illustrate the superior performance of the method of this invention. The examples are for illustrative purposes only and are not meant to limit the scope of the claims in any way.

EXAMPLE A

In this example, a series of highly durable and abrasion-resistant coatings were deposited by ion-assisted plasma deposition on 7" diameter optical grade polycarbonate discs (⅛" thick), which were set on the powered electrode of a Plasmalab 80 radio frequency diode reactor. The substrates were purchased with protective cling wrap, which was removed as the last step prior to pump down. In each run the vacuum chamber was then evacuated to a pressure less than $5\times10^{-3}$ Torr. Each substrate was sputter-etched and activated by exposure to an $O_2$ plasma (100 mTorr, 50 Watts (W)) for 2 minutes. This removed nearly 3000 Å of the polycarbonate surface. The $O_2$ plasma was extinguished, and then mixtures of hexamethyldisiloxane (HMDSO) and $O_2$ were admitted to the vacuum system. The power was set at 300 W. During the initial 30 seconds of deposition the pressure was maintained at $5\times10^{-2}$ Torr, while the remaining 10 min. of deposition were carried out at $1\times10^{-1}$ Torr. At $5\times10^{-2}$ Torr, a bias of −450 V was measured (with the electrode exposed), while at $1\times10^{-1}$ Torr the bias was −400 V. The electrode temperature was maintained at 20 degrees C. After completion of the deposition, the chamber was vented and the substrates were removed. Indentation hardness measurements were obtained using a Nano Instruments, Incorporated (Oak Ridge, Tenn.) Nanoindenter II instrument. Strain to microcracking measurements were carried out by bending 1 cm×10 cm strips cut from each sample over a four point bending fixture, and the onset of microcracking was visually determined. The strain to microcracking values were then calculated from the critical radii of curvature. The abrasion resistance of the coated samples was determined by the Taber Abrasion test, using abrasion by CS10 wheels for 300 cycles with 500 g weights. The abrasion damage was quantified by the change in haze before and after abrasion. Haze values were obtained in accordance to ASTM D1003, using a Gardner hazemeter. Values for the yellow index ($Y_I$) were calculated from transmission spectra in the visible range according to ASTM D1925. The yellow index values were obtained several days after the samples were made. It was observed in the course of this investigation that those radio frequency deposited organosilicon samples that are produced with visible yellowness (with yellow index greater than 2.5), particularly those grown from organosiloxane feed gases, undergo a noticeable reduction in color when they are exposed to ambient conditions.

Measurements of thickness, hardness, initial haze (prior to abrasion testing) and yellow index of the coated substrates for the samples prepared in Example A are presented in Table 1.

TABLE 1

| HMDSO (sccm) | Oxygen (sccm) | Thickness (microns) | Hardness (GPa) | Haze* (%) | Yellow Index |
|---|---|---|---|---|---|
| 131 | 0 | 12.8 | 1.4 | 2.7 | 1.8 |
| 99 | 33 | 12.3 | 2.1 | 1.8 | 1.4 |
| 66 | 66 | 10.1 | 3.1 | 1.3 | 3.5 |
| 33 | 100 | 6.1 | 4.2 | 0.96 | 4.6 |

*Haze = initial haze of sample immediately after coating

Measurements of coating thickness, hardness, strain to microcracking and Taber Abrasion test (change in haze) for the samples prepared in Example A are presented in Table 2.

TABLE 2

| HMDSO (sccm) | Oxygen (sccm) | Thickness (microns) | Hardness (GPa) | STM** (%) | Taber Haze (%) |
|---|---|---|---|---|---|
| 131 | 0 | 12.8 | 1.4 | 3.1 | 8.1 |
| 99 | 33 | 12.3 | 2.1 | 2.9 | 1.1 |
| 66 | 66 | 10.1 | 3.1 | 2.5 | 1.2 |
| 33 | 100 | 6.1 | 4.2 | 2.2 | 1.9 |

**STM = strain to microcracking

A sample of optical grade polycarbonate coated with General Electric Margard polysiloxane coating had a hardness of 0.5 GPa, a strain to microcracking of 1.4%, and experienced a change in haze of 5.8% in the Taber Abrasion test. A sample of plate glass had a hardness of 6 GPa, and experienced a change in haze of 1.4% in the Taber Abrasion test.

The results in Tables 1 and 2 demonstrate that the three coatings made by ion-assisted plasma deposition from mixtures of HMDSO and $O_2$ are flexible and softer than glass, yet exhibit excellent abrasion resistance. They exhibit good optical properties in that they are highly transmissive in the visible, and have yellow index values less than 5 and initial haze values less than 2%.

EXAMPLE B

The plasma ion beam deposition process was used to coat two 2"×2"×0.125" CR-39 poly(allyl diglycolcarbonate) flat substrates, a CR-39 poly(allyl diglycolcarbonate) lens, a 2"×2"×0.125" polycarbonate substrate and a 3" diameter Si(001) wafer with a transparent, highly abrasion-resistant coating layer as follows. First, the samples were ultrasonically cleaned in isopropanol followed by drying with nitrogen gas. Next, the cleaned samples were mounted on a 18" diameter aluminum plate with Kapton tape and the plate was mounted in a stainless steel vacuum chamber which was subsequently evacuated to a pressure of $4.4 \times 10^{-5}$ Torr by a 10" diameter diffusion pump. The samples were sputter etched for 5 minutes with an argon ion beam generated by an End Hall ion source (manufactured by Commonwealth Scientific as Mark II) using 10 sccm argon gas introduced directly into the plasma chamber of the ion source. The anode potential was 30 volts while the current was 5.8 amps. The electron source for the End Hall ion source was a hollow cathode operated on 3 sccm argon gas. After sputter-etching the substrates, a highly abrasion-resistant coating layer was deposited by plasma ion beam deposition. Approximately 16 sccm of octamethylcyclotetrasiloxane was introduced into the argon beam through nozzles located approximately 1" downstream of the ion source. The anode potential was 58 volts while the anode current was 5.8 amps. This condition was used to deposit a Si—O—C—H layer about 2,000 Å–3,000 Å thick, which improved the adhesion of the abrasion-resistant coating layer to the substrates. After operating for 3.5 minutes with these conditions, 10 sccm of oxygen gas were introduced. After operating for an additional 30 seconds, the oxygen flow was increased to 30 sccm. After an additional 30 seconds, the oxygen flow was increased to 50 sccm. After an additional 30 seconds, the oxygen flow was increased to 70 sccm and the argon was shut off. The anode potential was 56 volts and the anode current was 5.72 amps. The chamber pressure was $1.45 \times 10^{-3}$ Torr. The ion source plasma and ion beam were extinguished 40 minutes after the first introduction of the octamethylcyclotetrasiloxane. The chamber was brought to atmospheric pressure and the samples were removed. The coated samples were water-clear when viewed in visible light. Approximately 5.5 microns of coating was deposited onto the samples.

The compressive stress of the coating was $7.7 \times 10^8$ dynes/cm$^2$. The haze measured on the CR-39 poly(allyl diglycolcarbonate) samples was less than 0.4%. The abrasion resistance of the 2"×2"×0.125" piece of coated CR-39 poly(allyl diglycolcarbonate) was tested with a Taber Abrader using 500 grams load with CS-10F wheels (total of 1 kg load). After 500 cycles, the change in haze was determined to be 0.65%. Glass tested in an identical fashion had a change in haze of 0.69% after 500 cycles. The coating contained the elements silicon, oxygen, carbon and hydrogen.

EXAMPLE C

The plasma ion beam deposition process was used to coat two CR-39 poly(allyl diglycolcarbonate) lenses, and two CR-39 poly(allyl diglycolcarbonate) 2"×2"×0.125" pieces with a transparent, highly abrasion-resistant coating layer as follows. First, the samples were ultrasonically cleaned in isopropanol and then dried using nitrogen gas. Next, the cleaned samples were mounted on an 18" diameter aluminum disk with Kapton tape. The disk was mounted into a stainless steel vacuum chamber which was pumped with a 10" diffusion pump. The chamber was evacuated to a pressure of $1.6 \times 10^{-5}$ Torr. The samples were sputter-etched for 5 minutes using an argon ion beam generated by an End Hall ion source (used in Example B) with 17.4 sccm of argon gas directly into the plasma chamber of the ion source, an anode potential of 80 volts, and an anode current of 4.22 amps. The electron source for the End Hall ion source was a hollow cathode. A shutter was then placed between the ion source and the substrates to block the ion beam, and 100 sccm of oxygen gas was run into the plasma chamber of the ion source, the argon was turned off, and octamethylcyclotetrasiloxane was allowed into the chamber through nozzles located approximately 1" downstream of the ion source to initiate the plasma ion beam deposition of the highly abrasion-resistant material on the substrates. The anode potential was 72 volts and the anode current was 5.57 amps. The pressure during this process was $1.25 \times 10^{-3}$ Torr. After 72 minutes of operation at this condition, the ion source plasma and ion beam were extinguished and the chamber was brought to atmospheric pressure, and the substrates were removed. The samples were water-clear in visible light. The coating thickness was 7.6 microns and the compressive stress was $5.7 \times 10^8$ dynes/cm$^2$. The hardness of the coating (measured by nanoindentation) was 3.4 GPa. For reference, the hardness of quartz measured by the same technique was 10 GPa.

EXAMPLE D

The plasma ion beam deposition process was used to coat two 2"×2"×0.125" CR-39 poly(allyl diglycolcarbonate) flat substrates, a CR-39 poly(allyl diglycolcarbonate) lens, a 2"×2"×0.125" polycarbonate substrate, a 8" diameter× 0.125" thick polycarbonate substrate and a 3" diameter Si(001) wafer with a transparent, highly abrasion-resistant coating layer as follows. First, the samples were ultrasonically cleaned in isopropanol followed by drying with nitrogen gas. Then, the cleaned samples were mounted on 8.5" diameter disks with Kapton tape and the disks were mounted in a stainless steel vacuum chamber on a planetary drive which was subsequently evacuated to a pressure of $5 \times 10^{-6}$ Torr by a 10" diameter diffusion pump. The samples were sputter etched for 2 minutes with an argon ion beam generated by an End Hall ion source (used in Example B) using 3 sccm argon gas introduced directly into the plasma chamber of the ion source. The anode potential was 50 volts while the current was 5.6 amps. The electron source for the End Hall ion source was a hollow cathode operated on 3 sccm argon gas. After sputter-etching the substrates, the plasma ion beam deposition process was initiated by introducing approximately 16 sccm of octamethylcyclotetrasiloxane into the argon beam through nozzles located approximately 1" downstream of the ion source. The anode potential was 59 volts while the anode current was 5.8 amps (ion beam current approximately 1.5 amps). After operating for 3.0 minutes with these conditions, 70 sccm of oxygen gas was introduced into the plasma chamber of the ion source and the argon flow was reduced to 0.0 sccm. The anode potential was 57 volts and the anode current was 5.79 amps (ion beam current approximately 1.5 amps). The chamber pressure was $1.4 \times 10^{-3}$ Torr. The ion source plasma and ion beam were extinguished 40 minutes after the first introduction of the octamethylcyclotetrasiloxane. The chamber was brought to atmospheric pressure and the samples were removed. The coated samples were water-clear when viewed in visible light. A 4.8 micrometer thick coating was deposited onto the samples.

The compressive stress of the coating was $6.4 \times 10^8$ dynes/cm$^2$. The tensile strain to microcracking of the coating was determined using a four point bend technique. Coated polycarbonate pieces, 1 cm×10 cm, were cut from the 8" diameter disk and mounted in the four point bend apparatus. The samples were bent until microcracking of the coating was observed. The radius of curvature was measured and the strain was calculated. The results indicate that the strain to microcracking was 2.1–2.2%.

EXAMPLE E

The plasma ion beam deposition process is used to apply highly durable and abrasion-resistant composite multilayer dielectric coatings onto a variety of plastic lenses as follows. A clear polycarbonate safety len, a polycarbonate semifinished ophthalmic lens blank, a one-piece shield polycarbonate sports lens, a polycarbonate visor, a poly(allyl diglycolcarbonate) finished ophthalmic lens blank, and a polycarbonate sunglass lens are ultrasonically cleaned in soap and water, rinsed with deionized water, and blown dry with clean filtered air. The clear polycarbonate safety lenses, the polycarbonate semifinished ophthalmic lens blank are coated with an acrylic polymer coating which is applied by spin coating to a thickness of 3.5 mm, followed by curing with ultraviolet light. The one-piece shield polycarbonate sports lens, the polycarbonate visor, the poly(allyl diglycolcarbonate) finished ophthalmic lens blank, and the polycarbonate sunglass lens are coated with a polysiloxane polymer coating which is applied by a dip coating to a thickness of 4 mm, followed by thermal curing. The lenses are mounted onto a planetary stage of a stainless steel vacuum chamber, and the chamber is evacuated to a pressure of $5 \times 10^{-6}$ Torr by a 10" diameter diffusion pump, and a cryocoil. The lens substrates are sputter etched for 5 minutes with an argon ion beam generated by an End Hall ion source (as in Example B) using 10 sccm argon gas introduced directly into the plasma chamber of the ion source. The anode potential is 30 volts, and the current is 5.8 amps. The electron source for the End Hall ion source is a hollow cathode operated on 3 sccm argon gas. After sputter-etching the lens substrates, the plasma ion beam deposition process is initiated by introducing approximately 16 sccm of octamethylcyclotetrasiloxane into the argon beam through nozzles located approximately 1" downstream of the ion source. The anode potential is 58 volts, and the anode current is 5.8 amps. After operating for 3.5 minutes at these conditions, 10 sccm of oxygen gas is introduced into the ion source plasma chamber. After operating for an additional 90 seconds, the oxygen flow is increased to 70 sccm and the argon is shut off. The anode potential is 56 volts, and the anode current is 5.72 amps. The chamber pressure is $1.45 \times 10^{-3}$ Torr. The ion beam source is operated under these conditions for a total of 60 minutes to plasma ion beam deposit an abrasion-resistant first coating layer composed of "silicon oxycarbide" (Si, O, C, and H) which is 8 micrometers thick.

After completing the deposition of the layer of abrasion-resistant material, the flow of octamethylcyclotetrasiloxane is extinguished, and 20 sccm of silane is introduced through a nozzle 1" downstream of the ion source. The oxygen gas flow through the plasma chamber of the ion source is maintained at 70 sccm. The anode potential is 100 volts and the anode current is 1 amp. These conditions result in deposition of a layer of amorphous silicon dioxide dielectric material that has a thickness of 800 Å. After operation at these conditions for 2 minutes, the silane and oxygen gases are turned off, and methane gas is introduced directly into the plasma chamber of the ion source at a flow of 10 sccm resulting in a pressure of $6.6 \times 10^{-5}$ Torr. The anode voltage is 172 volts and the anode current is 1.08 amps. After 1.7 minutes of operation at these conditions, an adherent 1000 Å thick DLC dielectric coating layer is deposited. Then, the ion source plasma and ion beam are extinguished, the gas flows are terminated, and the chamber is brought to atmospheric pressure, and the lenses are removed.

The coatings on all of the lens substrates are optically transparent, and exhibit gold-brown reflected color when viewed in visible light. The multilayer composite coatings consisting of a first layer of abrasion-resistant coating material which is 8 mm thick, and a second composite dielectric layer comprising an 800 Å thick layer of silicon dioxide, and a 1000 Å thick top layer of DLC. The multilayer composite coating is found to have excellent chemical resistance in environmental exposure tests such as QUV weathering, and boiling salt water exposure, and is found to have outstanding ion resistance to steel wool abrasion, and a Bayer value greater than 10 in Bayer abrasion tests.

EXAMPLE F

The plasma ion beam deposition process was used to apply abrasion-resistant first coating layers to a variety of plastic lenses, which were then coated with multilayer dielectric blue mirror coatings by several methods as follows.

A variety of polycarbonate plano blank sunglass lenses (coated with a 4.5-micrometer thick polysiloxane polymer coating), polycarbonate semifinished prescription sunglass lens blanks (coated with a 4.5-micrometer thick polysiloxane polymer coating), and uncoated CR-39 poly(allyl diglycolcarbonate) clear plano lens blanks were ultrasonically cleaned in soap and water, rinsed with deionized water, and air dried. The lenses were coated with an abrasion-resistant first coating layer of silicon oxy-carbide material (Si—O—C—H) by plasma ion beam deposition, using process conditions similar to those in the previous examples, using octamethylcyclotetrasiloxane precursor gas and oxygen, and a chamber pressure of about $1.6 \times 10^{-3}$ Torr. The deposition was terminated after a 5-micrometer thick first layer of abrasion-resistant "silicon oxycarbide" (Si, O, C, and H) material was deposited. Then, the deposition process was terminated by shutting off the process gases. The vacuum chamber was vented, and the lenses coated with a first layer of abrasion-resistant coating material were removed.

Selected lenses with the first coating of abrasion-resistant material were then coated with a second coating of dielectric material to achieve reflected blue colored mirrors. Six different dielectric coating processes were performed as follows:

(1) Process #1—glow discharge pre-clean, followed by a multilayer stack of alternating layers of the prefered dielectric materials of evaporated silicon oxide and titanium oxide;

(2) Process #2—ion beam sputter-clean, followed by a multilayer stack of alternating layers of the prefered dielectric materials of evaporated silicon oxide and titanium oxide;

(3) Process #3—glow discharge pre-clean, followed by a multilayer stack of a thin layer of evaporated chrome and a layer of silicon oxide.

(4) Process #4—argon ion-assisted RF plasma sputter-clean, followed by magnetron sputter deposition of about 100 Å of titanium, followed by reactive magnetron sputter deposition of about 600 Å of titanium oxide;

(5) Process #5—ion sputter-clean, followed by a 9-layer coating of alternating layers of the prefered dielectric materials of silicon oxide and titanium oxide (top layer) deposited by ion-assisted evaporation.

(6) Process #6—argon ion beam sputter clean, followed by ion beam sputter-deposition of about 400 Å of silicon oxide, then ion beam sputter-deposition of about 60 Å of chromium, then ion beam sputter-deposition of another layer of about 400 Å of silicon oxide, and finally direct ion beam deposition of about 600 Å of DLC.

A second coating of a dielectric reflective blue mirror was obtained on the lenses by all six processes. The lenses were tested for durability in boiling salt water (BSW) for a maximum of 60 minutes, then adhesion pull testing with scotch tape. The weatherability of the coated lenses was tested by exposure in a QUV Weathering tester (Q-Panel Instruments) using alternating cycles of condensation for 4 hours at 50 degrees C., and 4 hours of UVB exposure (UVB-313 lamps) at 50 degrees C. for a maximum of 15 days. Abrasion resistance was determined by the Bayer Abrasion Test, using reciprocating abrasion with sifted sand. After 300 abrasive cycles, the change in haze from the initial, as-coated value was determined. A Bayer Value for each lens was calculated by dividing the change in haze for an uncoated Silor CR-39 poly(allyl diglycolcarbonate) plano lens by the change in haze for the coated lens. By this method, a Bayer Value of 1 indicates an abrasion resistance equal to that of CR-39. Typical glass lenses have Bayer values of about 4–5. The test results for lenses coated by the six processes are summarized in Table 3.

TABLE 3

| Process | BSW Test | QUV Test | Bayer Value |
| --- | --- | --- | --- |
| #1 | Fail at 15 min. | Bad staining | 0.7 |
| #2 | Fail at 5 min. | Color loss | 1 |
| #3 | Fail at 35 min. | Color fade | 3–9 |
| #4 | Pass 60 min. | Pass | 3–9 |
| #5 | Pass 60 min. | Pass | no sample |
| #6 | Pass 60 min. | Pass | 11–39 |

The abrasion-resistant coating layers of the present invention have very good optical properties (low haze and low yellow index) as shown in Table 1. Some of the outstanding mechanical properties of the abrasion-resistant first coatings of the present invention are shown in Table 2, in which the relationship between strain to microcracking and hardness is displayed for a series of coatings deposited by the radio frequency ion-assisted plasma deposition method on polycarbonate substrates. The coatings were made from various mixtures of oxygen and HMDSO, with the harder materials produced with higher $O_2$: HMDSO flow ratios. Details of the process conditions are provided in Example A. These data indicate an inverse relationship between hardness and flexibility; soft materials tend to be flexible, while hard materials are generally not. Yet, surprisingly, by comparison to the abrasion-resistant coating layers of the present invention, General Electric's Margard MR5 (a commercially available polysiloxane coating) is both soft and brittle. It was found that other wet chemical polysiloxane coatings performed similarly.

Preliminary solid state Nuclear Magnetic Resonance characterization and density measurements indicate that Margard MR5 is highly crosslinked yet has low density, while the coatings described in Example A below are not as highly crosslinked but are more dense. This may explain why MR5 is soft yet brittle, while the abrasion-resistant first coating layers of the present invention are harder yet more flexible.

In Table 2, the Taber abrasion performance (CS 10 wheels, 300 cycles, 500 g/wheel) of the radio frequency ion-assisted plasma deposited coatings described in Example A, is shown for coatings of different hardness. Totally unexpectedly, it was found that the ion-assisted RF plasma-deposited abrasion-resistant coatings of the present invention with hardness as low as 2 GPa experienced as little or less damage in this severe abrasion test than did the much harder plate glass (with 6 GPa hardness). The coatings with hardness greater than 2 GPa clearly provide much better abrasion protection than does the MR5 polysiloxane coating.

The surprising abrasion performance may in fact be due to the high strain to microcracking of these coatings. Soft substrates provide little mechanical support for the coating against penetration of abrading asperities. The onset of the coating failure, which is initiated by tensile fracture at the coating-substrate interface, occurs at lower penetration depths with brittle coatings. In addition, deep scratches in brittle coatings are usually more noticeable due to debris formation, jagged edges, and wider scratch grooves, all of which tend to scatter light.

These results were substantiated by scratch testing performed using a Nano Instruments Nanoindentor II instrument. In scratch tests, the width of scratches was smallest on the abrasion-resistant coating layers of the present invention when compared to glass and other commercially available coatings on polymer substrates.

Therefore, the results of Example A which are summarized in Tables 1 and 2 show that the ion-assisted plasma deposited coatings of the abrasion-resistant materials of the present invention have the unique properties of being harder, yet more flexible, and much more abrasion-resistant than standard commercial polysiloxane polymer coatings such as General Electric's Margard. These results also show that the ion-assisted plasma deposited coatings of the abrasion-resistant materials of the present invention are less hard than glass, but they have abrasion resistance greater than or equal to that of glass. The coatings of the abrasion-resistant materials of the present invention are also much more flexible than glass.

Examples B, C and D demonstrate that the plasma ion beam deposition process of the present invention can produce highly optically transparent, water-clear, low stress, adherent, hard, abrasion-resistant coatings containing silicon, carbon, oxygen, and hydrogen on optical plastic lens substrates at high deposition rates. For high rate deposition of these materials, the Hall Accelerator and End Hall sources are preferred ion beam sources because of their ability to produce high ion beam currents. Additionally, these high ion beam currents are produced at low ion beam energies, which results in reduced substrate heating and other advantageous properties of the coating.

A unique advantage of the use of the ion beam method for producing these materials is the relationship between stress and hardness. It is well known in the prior art that stress and hardness are often strongly related. Typically, the greater the compressive stress, the harder the material. For the case of the Si—O—C—H abrasion-resistant coating layer materials produced by injecting organosiloxane precursors into an oxygen plasma ion beam, it was unexpectedly found that by increasing the ratio of oxygen to siloxane precursor, the coating hardness was increased, while the compressive stress was simultaneously decreased. By this method, it is possible to produce hard, abrasion-resistant coatings which are under tensile stress, or are nearly stress-free. This is a very unexpected result for an energetic deposition process, and a key technical advantage of the abrasion-resistant first coating layers of the present invention.

It is believed that the reduction in compressive stress with increasing hardness is due to the etching of carbon from the growing surface by the oxygen ions, or activated oxygen in the ion beam. It has been observed by Energy Dispersive Spectroscopy that the carbon signal in the deposited coatings decreases with increasing oxygen flow rate for a fixed siloxane precursor flow rate. It is believed that the reduction is in compressive stress with increasing coating hardness is unique to the ion beam process of the present invention.

The properties of the abrasion-resistant coating materials described in Examples A, B, C, and D that make them highly attractive and unique are hardness which is about 10 to about 20 times greater than that of optical plastics such as polycarbonate and poly(allyl diglycolcarbonate), which have typical hardness 0.2–0.3 GPa, or polymer coatings, and high flexibility and high tensile strain to microcracking. Compositionally, the coatings are not $SiO_2$, but rather contain significant amounts (>5 atomic percent) of carbon and, therefore, do not show brittle fracture failure as is exhibited by glass or quartz coatings.

In a preferred embodiment of the present invention, an abrasion-resistant first coating comprising silicon, oxygen, carbon, hydrogen, and possibly nitrogen having the properties of Nanoindentation hardness in the range of about 2 to about 5 GPa and a tensile strain to microcracking greater than about 1% is deposited. When applied to plastic substrates, this coating produced Taber abrasion resistance test results equivalent to or better than that of glass. Because of these outstanding properties, the abrasion-resistant coatings are particularly well suited as underlayer coatings for multilayer dielectric coatings applied to plastic optical substrates such as ophthalmic lenses, sunglass lenses, safety lenses, and sports optics.

The Example E process described above provides a coated sunglass lens with a multilayer composite coating consisting of an abrasion-resistant first coating which is 8 micrometers thick, and a second dielectric coating comprising an 800 Å thick layer of silicon dioxide, and a 1000 Å thick top layer of DLC. The multilayer coating has the advantage of outstanding abrasion-resistance provided both by the thick abrasion-resistant first layer, and the low friction DLC top layer. The DLC top layer provides the attractive gold-brown reflected color, as well as outstanding resistance to attack by environmental exposure.

The test results summarized in Example F and Table 3 clearly show that a the present invention can create highly durable colored mirror sunglass lenses. Lenses coated with a composite abrasion-resistant first coating layer, followed by an evaporated composite dielectric layer were able to achieve the desired blue color, but did not perform well in the Bayer Abrasion test or in the boiling salt water durability test. Lenses coated with an abrasion-resistant first coating, followed by a magnetron sputtered dielectric coating layer (Process #4), a 9-layer dielectric layer stack deposited by ion-assisted evaporation (Process #5), and a 4-layer dielectric stack coating deposited by ion beam sputter deposition and ion beam deposition of DLC (Process #6) all performed well in boiling salt water and in the QUV weathering test. Lenses coated with an abrasion-resistant first coating layer, followed by a magnetron sputtered dielectric coating layer (Process #4), and a 4-layer dielectric stack coating deposited by ion beam sputter deposition and ion beam deposition of DLC (Process #6) had Bayer values greater than or equal to that of glass. It is expected that lenses coated by Process #5 would also have excellent performance in the Bayer test. The lenses coated with an abrasion-resistant first coating layer, and a second composite dielectric layer with a top coating of DLC performed the best, with Bayer values greater than twice that of glass.

The dielectric stack design of Process #5 (ion-assisted evaporation deposition of silicon oxide and titanium oxide alternating layers) could be modified by means known in the art, and applied to both sides of an ophthalmic lens to produce an antireflection coating. When applied over the top of the abrasion-resistant first coating, this antireflection coating will exhibit outstanding durability and abrasion-resistance. The same result could be achieved by using other quarter wave optical stack configurations and non-quarter wave optical stack configurations with other aforementioned dielectric materials to produce antireflection-coated lenses of outstanding durability and abrasion-resistance, provided these multilayer dielectric coatings are deposited over the top of the abrasion-resistant first coating of the present invention, and deposition of the dielectric layers is carried out by ion-assisted evaporation, magnetron sputtering, ion beam sputtering, or ion-assisted plasma deposition, including plasma ion beam deposition.

All of the examples demonstrate that highly durable and abrasion-resistant multilayer dielectric coatings can be applied to lens substrates such as optical plastics by the ion-assisted plasma deposition process, including plasma ion beam deposition, of the present invention. For example, coated plastic lenses, which have abrasion resistance equal to or greater than that of glass can be produced. Because of the high coating deposition rates which can be attained, the invention provides an economical manufacturing process.

From the foregoing description, one of ordinary skill in the art can easily ascertain that the present invention provides an improved method for producing highly durable and abrasion-resistant multilayer dielectric coatings on a variety of lens substrates, including ophthalmic lenses, sunglass lenses, safety lenses, and sports optics. The multilayer dielectric coatings of the present invention are ideal for plastic lenses. Highly important technical advantages of the present invention include outstanding adhesion of the plasma ion beam deposited coatings, outstanding abrasion resistance, and ease and flexibility of mass production.

Without departing from the spirit and scope of this invention, one of ordinary skill in the art can make various changes and modifications to the invention to adapt it to various usages and conditions. As such, these changes and modifications are properly, equitably, and intended to be, within the fall range of equivalents of the following claims.

What is claimed is:

1. An abrasion-resistant dielectric composite product comprising a lens substrate coated on at least one surface with a first coating of an abrasion-resistant coating material comprised of carbon, hydrogen, silicon and oxygen, using ion-assisted plasma deposition and using mixtures of oxygen and organosiloxane or organosilazane precursor gases, and a second coating comprised of a substantially optically transparent dielectric material; said abrasion-resistant coating material having the properties of Nanoindentation hardness in the range of about 2 GPa to about 5 GPa, a strain to microcracking greater than 1.5% and less than 3.5%, and an abrasion resistance greater than or equal to the abrasion resistance of glass.

2. The product of claim 1 wherein said abrasion-resistant coating material has a transparency greater than 85% in the visible spectrum.

3. The product in claim 1 wherein the thickness of the abrasion-resistant coating material is in the range of about 5 micrometers to about 20 micrometers.

4. The product of claim 3, wherein said dielectric material is selected from the group consisting of aluminum oxide, barium fluoride, boron nitride, hafnium oxide, indium tin oxide, lanthanum fluoride, lanthanum oxide, magnesium fluoride, magnesium oxide, scandium oxide, silicon monoxide, silicon dioxide, silicon oxy-carbide, silicon oxy-carbonitride, silicon nitride, silicon oxy-nitride, tantalum oxide, tin oxide, titanium oxide, yttrium oxide, zinc oxide, zinc selenide, zinc sulfide, zirconium oxide, a mixture of zirconium oxide and zirconium titanate, and diamond-like carbon.

5. The product of claim 4 wherein multiple layers of said dielectric material having different refractive index are deposited to form an antireflection coating on said lens substrate coated with said abrasion-resistant coating.

6. The product of claim 4 wherein at least one layer of said dielectric material is deposited to form a reflective colored mirror coating on said lens substrate coated with said abrasion-resistant coating.

7. The product of claim 4 wherein multiple layers of said dielectric material having different refractive index are deposited to form a reflective colored mirror coating on said lens substrate coated with said abrasion-resistant coating.

8. The product of claim 6 wherein said composite product further comprises at least one reflecting layer of metallic material between said abrasion-resistant coating material and a said layer of said dielectric material.

9. The product of claim 8 wherein said metallic material is selected from the group consisting of aluminum, chromium, germanium, hafnium, silicon, tantalum, titanium, zirconium and mixtures thereof.

10. The product of claim 7 wherein said coated substrate product further comprises at least one reflecting layer of metallic material between said abrasion-resistant coating material and said multiple layers of said dielectric material.

11. The product of claim 10 wherein said metallic material is selected from the group consisting of aluminum, chromium, germanium, hafnium, silicon, tantalum, titanium, zirconium and mixtures thereof.

12. The product of claim 1 wherein the composite product is a vision-correcting ophthlamic lens.

13. The product of claim 1 wherein the composite product is a plano lens.

14. The product of claim 1 wherein the composite product is a sunglass lens.

15. The product of claim 1 wherein the composite product is a safety lens.

16. The product of claim 1 wherein said lens substrate comprises a plastic selected from the group consisting of polymethylmethacrylate, polycarbonate, urethanes, olefins, poly(allyl diglycolcarbonate), copolymers and blends of polycarbonate, acrylics, urethanes, olefins and poly(allyl diglycolcarbonate).

17. The product of claim 16 wherein said composite product further comprises an adhesion-enhancing polymer coating between said plastic lens substrate and said abrasion-resistant coating.

18. The product of claim 17 wherein the thickness of said adhesion-enhancing polymer layer has a thickness less than about 10 micrometers.

19. The product of claim 18 wherein said adhesion-enhancing polymer layer is selected from the group consisting of an acrylic polymer, a urethane polymer and a polysiloxane polymer.

20. The product of claim 17 wherein the thickness of said abrasion-resistant coating material is in the range of about 5 micrometers to about 20 micrometers.

21. The product of claim 1, wherein said dielectric material is selected from the group consisting of aluminum oxide, barium fluoride, boron nitride, hafnium oxide, indium tin oxide, lanthanum fluoride, lanthanum oxide, magnesium fluoride, magnesium oxide, scandium oxide, silicon monoxide, silicon dioxide, silicon oxy-carbide, silicon oxy-carbonitride, silicon nitride, silicon oxy-nitride, tantalum oxide, tin oxide, titanium oxide, yttrium oxide, zinc oxide, zinc selenide, zinc sulfide, zirconium oxide, a mixture of zirconium oxide and zirconium titanate, and diamond-like carbon.

22. The product of claim 21 wherein multiple layers of said dielectric material having different refractive index are deposited to form an antireflection coating on said plastic lens substrate coated with said abrasion-resistant coating.

23. The product of claim 21 wherein at least one layer of said dielectric material is deposited to form a reflective colored mirror coating on said plastic lens substrate coated with said abrasion-resistant coating.

24. The product of claim 21 wherein multiple layers of said dielectric material having different refractive index are deposited to form a reflective colored mirror coating on said plastic lens.

25. The product of claim 24 wherein said composite product further comprises a reflecting layer of metallic material between said abrasion-resistant coating material and a layer of said dielectric material.

26. The product of claim 25 wherein said metallic material is selected from the group consisting of aluminum, chromium, germanium, hafnium, silicon, tantalum, titanium, zirconium, and mixtures thereof.

27. The product of claim 23 wherein said coated substrate product further comprises a reflecting layer of metallic material between said abrasion-resistant coating material and a layer of said dielectric material.

28. The product of claim 27 wherein said metallic material is selected from the group consisting of aluminum, chromium, germanium, hafnium, silicon, tantalum, titanium, zirconium, and mixtures thereof.

29. The product of claim 1 wherein said abrasion-resistant material also contains nitrogen.

30. An abrasion-resistant dielectric composite product comprising a plastic lens substrate coated on at least one surface with a first coating of an adhesion-enhancing polymer on said substrate, a second coating of an abrasion-resistant coating material comprised of carbon, hydrogen, silicon, and oxygen, using ion-assisted plasma deposition and using mixtures of oxygen and organosiloxane or organosilazane precursor gases, and a third coating comprised of a substantially optically transparent dielectric material on said abrasion-resistant coating; said abrasion wear resistant coating material having a thickness in the range of about 5 micrometers to approximately 20 micrometers and having the properties of Nanoindentation hardness in the range of about 2 GPa to about 5 GPa, a strain to microcracking greater than 1.5% and less than 3.5%, an abrasion resistance greater than or equal to the abrasion resistance of glass, and a transparency greater than 85% in the visible spectrum.

31. The product in claim 30 wherein said plastic lens substrate is selected from the group consisting polymethylmethacrylate, polycarbonate, urethanes, olefins, poly(allyl diglycolcarbonate), copolymers and blends of polycarbonate, acrylics, urethanes, olefins and poly(allyl diglycolcarbonate).

32. The product of claim 30 wherein said adhesion-enhancing polymer layer is selected from the group consisting of an acrylic polymer, a urethane polymer and a polysiloxane polymer.

33. The product of claim 32 wherein the thickness of said adhesion-enhancing polymer layer is less than approximately 10 micrometers.

34. The product of claim 30 wherein said dielectric material is selected from the group consisting of aluminum oxide, barium fluoride, boron nitride, hafnium oxide, indium tin oxide, lanthanum fluoride, lanthanum oxide, magnesium fluoride, magnesium oxide, scandium oxide, silicon monoxide, silicon dioxide, silicon oxy-carbide, silicon oxy-carbonitride, silicon nitride, silicon oxy-nitride, tantalum oxide, tin oxide, titanium oxide, yttrium oxide, zinc oxide, zinc selenide, zinc sulfide, zirconium oxide, a mixture of zirconium oxide and zirconium titanate, and diamond-like carbon.

35. The product of claim 34 wherein multiple layers of said dielectric material having different refractive index are deposited to form an antireflection coating on said plastic lens substrate coated with said abrasion-resistant coating.

36. The product of claim 34 wherein at least one layer of said dielectric material is deposited to form a reflective colored mirror coating on said plastic lens substrate coated with said abrasion-resistant coating.

37. The product of claim 34 wherein multiple layers of said dielectric material having different refractive index are deposited to form a reflective colored mirror coating on said plastic lens.

38. The product of claim 37 wherein said composite product further comprises a reflecting layer of metallic material between said abrasion-resistant coating material and a layer of said dielectric material.

39. The product of claim 38 wherein said metallic material is selected from the group consisting of aluminum, chromium, germanium, hafnium, silicon, tantalum, titanium, zirconium and mixtures thereof.

40. The product of claim 36 wherein said coated substrate product further comprises a reflecting layer of metallic material between said abrasion-resistant coating material and a layer of said dielectric material.

41. The product of claim 40 wherein said metallic material is selected from the group consisting of aluminum, chromium, germanium, hafnium, silicon, tantalum, titanium, zirconium and mixtures thereof.

42. The product of claim 30 wherein the composite product is a vision-correcting ophthlamic lens.

43. The product of claim 30 wherein the composite product is a plano lens.

44. The product of claim 30 wherein the composite product is a sunglass lens.

45. The product of claim 30 wherein the composite product is a safety lens.

46. The product of claim 30 wherein said abrasion-resistant material also contains nitrogen.

* * * * *